United States Patent [19]
Taylor et al.

[11] Patent Number: 5,348,693
[45] Date of Patent: Sep. 20, 1994

[54] FORMATION OF THREE DIMENSIONAL OBJECTS AND ASSEMBLIES

[75] Inventors: Charles S. Taylor, San Francisco; William B. Tiffany, Palo Alto; Paul Cherkas, Saratoga; John J. Frantzen, San Jose; Hilary J. Hampton, Santa Clara; Leonard Nanis, Palo Alto; Bhupendra O. Shah, Cupertino, all of Calif.

[73] Assignee: Advanced Cardiovascular Systems, Inc., Santa Clara, Calif.

[21] Appl. No.: 791,044

[22] Filed: Nov. 12, 1991

[51] Int. Cl.$^5$ .................... B29C 35/08; B29C 41/02
[52] U.S. Cl. .................... 264/22; 156/89; 156/155; 156/273.3; 156/273.5; 156/275.5; 156/307.1; 264/63; 264/132; 264/221; 264/255; 264/308; 264/317; 427/510; 427/555; 427/559
[58] Field of Search .................... 264/22, 125, 63, 132, 264/135, 221, 225, 255, 308, 317; 156/59, 62.2, 272.8, 155, 273.3, 273.5, 275.5, 307.1, 89; 427/510, 508, 553, 554, 555, 559; 29/604

[56] References Cited

U.S. PATENT DOCUMENTS

| | | |
|---|---|---|
| 3,264,385 | 8/1966 | Reed .................... 264/132 |
| 3,390,447 | 7/1968 | Mears .................... 29/604 |
| 4,113,480 | 9/1978 | Rivers .................... 264/63 |
| 4,575,330 | 3/1986 | Hull .................... 264/22 |
| 4,698,907 | 10/1987 | Soszek .................... 29/846 |
| 4,752,352 | 6/1988 | Feygin .................... 156/59 |
| 4,863,538 | 9/1989 | Deckard .................... 264/125 |
| 5,059,266 | 10/1991 | Yamane et al. .................... 264/22 |
| 5,088,047 | 2/1992 | Bynum .................... 156/62.2 |
| 5,094,935 | 3/1992 | Vassiliou et al. .................... 156/59 |
| 5,156,697 | 10/1992 | Bourell et al. .................... 156/62.2 |

*Primary Examiner*—Leo B. Tentoni
*Attorney, Agent, or Firm*—Crosby, Heafey, Roach & May

[57] ABSTRACT

A method and system for making a three dimensional product wherein the size and shape of a plurality of cross-sectional segments of the three dimensional object are determined which when assembled together in a particular sequence form the desired three dimensional shape. Thin layers of material in the shape of each of the cross-sectional segments are applied in the particular sequence in which they form the three dimensional object. The application of each of the layers is much like a lithographic printing process in that a resin may be applied by a roller in the shape of the cross-sectional segments.

28 Claims, 2 Drawing Sheets

FORMATION OF THREE DIMENSIONAL OBJECTS AND ASSEMBLIES

BACKGROUND OF THE INVENTION

This invention is directed to an improved method and system for forming multilayered, three dimensional objects and assemblies and the improved products formed thereby.

In the last few years significant efforts have been made to develop manufacturing and modeling systems based on computer assisted design (CAD) and computer assisted manufacturing (CAM). For example, a procedure and system is described in U.S. Pat. No. 4,575,330 (Hull) wherein a computer controlled beam of radiation is employed to cure a sequence of thin plastic layers of predetermined shape on a substrate disposed within a bath of radiation curable polymer resin. The particular shape and dimensions of the cured thin plastic layers are controlled by controlling the application of the radiation by a suitably programmed computer to form the three dimensional object having the desired shape.

Another similar process and system for forming three dimensional objects is described in U.S. Pat. No. 4,752,352 (Feygin) wherein a layer of powdered material is applied to a substrate and consolidated by pressure and then a computer controlled laser beam is applied to the surface of the layer of compressed powder to sinter a portion thereof which is a cross-sectional segment of a three dimensional object.

In the same Feygin patent another method and system of forming a three dimensional object is described wherein the cross-sectional segments or layers of the object are preformed individually, assembled into the desired three dimensional shape and then joined together by suitable means to form the final product.

In yet another method and system of forming three dimensional objects, which is offered by the Cubital Corporation in Warren, Mich., a layer of curable plastic resin is applied to a substrate, an optical mask is positioned above the layer of plastic resin and radiation is directed through the clear or open portions of the mask to cure the layer of resin in a predetermined configuration, the uncured resin is removed and then the cavities left by the removal of the uncured resin are filled by melted wax which is solidified by applying a cold flat plate thereto. Subsequent layers of plastic are then sequentially applied in the same manner to form the three dimensional object. The wax is removed by heating or other suitable means. A computer creates the desired three dimensional shape of the desired object and then slices the shape into the shapes of the plurality of plastic layers which form the final shape.

A wide variety of other methods are described in the references listed below. The references listed are to be considered exemplary, not exhaustive on the subject.

U.S. Pat. No. 3,174,837 (Mears)
U.S. Pat. No. 3,390.447 (Mears)
U.S. Pat. No. 4,113,480 (Rivers)
U.S. Pat. No. 4,415,528 (Wiech)
U.S. Pat. No. 4,575,330 (Hull)
U.S. Pat. No. 4,698,907 (Soszek)
U.S. Pat. No. 4,710,253 (Soszek)
U.S. Pat. No. 4,740,410 (Muller, et al.)
U.S. Pat. No. 4,752,352 (Feygin)
U.S. Pat. No. 4,752,498 (Fudim)
U.S. Pat. No. 4,801,477 (Fudim)
U.S. Pat. No. 4,863,538 (Deckard)
U.S. Pat. No. 4,874,499 (Smith, et al.)
U.S. Pat. No. 4,915,757 (Rando)
U.S. Pat. No. 4,938,816 (Beaman, et al.)
U.S. Pat. No. 4,944,817 (Bourell, et al.)

While there has been much development in this area of technology, a need still exists for methods and systems to effectively form three dimensional products, particularly extremely small and complicated shapes such as are found in intravascular catheters and other devices which cannot be readily made by the prior methods. The present invention satisfies this need.

SUMMARY OF THE INVENTION

The present invention is directed to the method and system for making a three dimensional object by first developing the shapes and dimensions of a plurality of thin cross-sectional segments of the object which, when joined in proper sequence, form the desired size and shape of the three dimensional product and then forming the individual cross-sectional segments to form the three dimensional product.

The invention generally includes developing a plurality of planar cross-sectional segments, which when assembled and joined together in a prescribed sequence, form a three dimensional object or assembly of the desired size and shape. A plurality of sites are provided for forming the three dimensional objects. The number of formation sites are preferably at least equal to the number of different cross-sectional segments forming the three dimensional object or assembly. Individual layers of material are applied onto the formation sites in the shapes which have been previously developed for the individual cross-sectional segments of the three dimensional product and in the sequence in which they are joined together to develop the desired object or assembly. The layers should be of uniform thickness. The applied layers are consolidated and then, in a subsequent cycle, layers of material are applied in the shapes of the next cross-sectional segments in the appropriate sequence onto the consolidated layers at each of the formation sites. Preferably, in each cycle at least one desired three dimensional object or assembly is completed and at least one of such products is initiated. In each cycle all of the cross-sectional shapes may be applied simultaneously or sequentially.

In one presently preferred embodiment of the invention, the formation sites are arranged at locations so that a wedge or ramp of the cross-sectional segments is formed, extending from one location where only the first cross-sectional segment of the three dimensional object or assembly is formed, i.e. the formation of the desired three dimensional product begins, to a location where the last cross-sectional segment of the three dimensional object is applied, i.e. the formation of a desired three dimensional product is completed.

All of the individual cross-sectional segments need not be different. For example, products having some degree of symmetry may have one or more cross-sectional segments which are of the same size and shape. In this case, the number of formation sites need not be the same as the number of cross-sectional segments. Adjustments would have to be made in the sequencing of forming the layers to compensate. For example, in an idealized case where the sequence of three layers A, B and C is ABCBA, only three cross-sectional segments are used. The layers ABC are applied repetitively but the after the first layers are applied to the substrate, the relative positions of the formation sites and the means to apply the layers is adjusted so that in the second series, the first layer A of the series is to the immediate left of the first layer of A applied in the first series. In the third series the first layer A of the series is to the left of the first layer A in the second series. The first layer of the next two series are to the right of the first layer A in the third series. Products at only one of the formation sites will be of the proper sequence of layers, namely, ABCBA. The products formed at the other two sites would have improper layer sequencing and would therefore be discarded.

The means to apply the layers of material at the formation sites is adapted to apply layers of material sequentially in the shapes of each of the developed cross-sectional segments in a sequence which forms the three dimensional objects at each of the formation sites from the first to the last or in the reverse. After the formation of a layer of a desired cross-sectional shape and the consolidation thereof at each of the formation sites, the relative positions between the formation sites and the means used to apply the layers of material to the formation sites is then changed or shifted, preferably one formation site, so that the initial layers of materials may be applied to a bare substrate and all of the other layers are applied to adjacent formation sites in appropriate sequence and then are cured. Subsequent layers of materials are applied in the required shape to each of the formation sites for all of the cross-sectional segments in the same sequence as previously applied, with each cycle of layer application to the individual formation sites being shifted, preferably by one formation site. The cycles are continued until the desired number of final three dimensional products are formed. The formation sites may be arranged linearly such as on a continuous belt, in a circle such as on a rotating table or in other continuous arrangements.

In one presently preferred embodiment of the invention, a first material is applied to the formation sites and consolidated thereon to form at least part of the periphery of the desired cross-sectional segments formed of second material which is subsequently applied to the formation sites on the substrate. If the first material is to be subsequently removed to free-up the final product, it is sometimes call a sacrificial or negative material. The applied layers of first material sometimes may act as molds for at least part of the individual cross-sectional segments of the three dimensional product formed by the second material. A plurality of individual cross-sectional segments of the desired shapes are sequentially formed in essentially the same manner at formation sites to complete the formation of the three dimensional object, with each cross-sectional segment being bonded to the adjacent cross-sectional segment at each respective formation site. The first material, which may shape the positive material in the layers, may be removed after the completion of each cross-sectional segment or upon the complete formation of the three dimensional object or a part thereof. In the case where a multi-material three dimensional object is formed the first material may be left in place to form part of the final product.

In one particularly effective method of forming a three dimensional product, a thin film or layer of consolidatable material is first applied to an applicator surface in a desired pattern to form a cross-sectional segment of the product. A thin film or layer of consolidatable material is then transferred from the applicator surface onto the formation site in essentially the same pattern as on the applicator surface. This transfer is preferably a printing process where the applicator surface is pressed against the formation site. Offset lithographic, gravure, and letterpress printing are particularly attractive in this instance to transfer the image, i.e. the pattern of the thin layer of consolidated material, from the applicator surface to the formation site. The transferred pattern or image of the consolidatable material is then consolidated on the formation site. The film or layer applied to the formation site may be sacrificial or negative material which is employed to define the primary material which forms the three dimensional product, or it may be a primary material which forms the product. If it is the sacrificial or negative material, it may be removed after the positive material has been consolidated. The thin layer of consolidatable material may be applied to the applicator surface in a variety of ways, e.g. rolling a printing roller over a printing plate on which the pattern is formed. Other ways include an ink jet or ballistic particle beam. This process may be repeated, in register, to build up the layer thickness, or to add additional layers to the desired product.

The individual layers may be formed from a wide variety of materials including polymerizable polymers (or precursor thereof) and sinterable powders such as ceramics or metals. The materials may be applied in powder form, as a liquid, as a solid powder in a liquid carrier or in other suitable forms. Depending upon the nature of the material, the consolidation may be by polymerization, air drying, solvent evaporation, chemical reduction, compaction, sintering, heating to remove a binder which is sometimes call debinderizing or a combination of such steps.

The present invention allows for the formation of a wide variety of three dimensional objects including three dimensional assemblies with interacting or interlocked moving components in a wide variety of sizes. The method and system is very suitable for making very small articles which would have been for the most part impossible with prior methods and systems. Importantly, the method and system of the invention is particularly suitable for large volume production of three dimensional products. These and other advantages of the invention will become more apparent from the following detailed description thereof when taken in conjunction with the accompanying exemplary drawings.

DETAILED DESCRIPTION OF THE INVENTION

Figure 1:
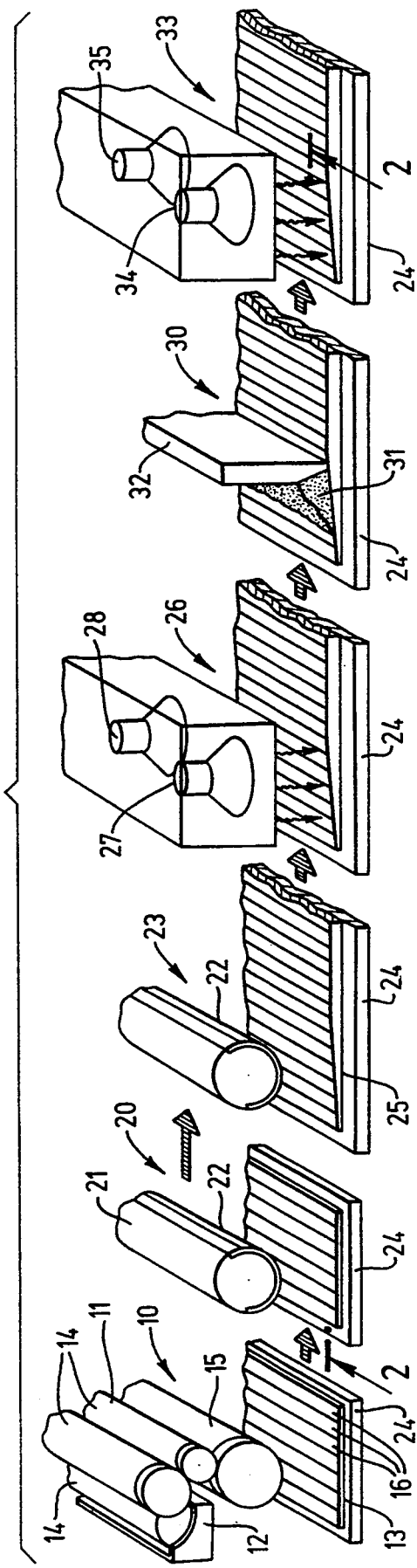
FIG. 1 is a perspective schematic view of an apparatus for performing the method for forming three dimensional objects embodying features of the invention.

FIG. 1 illustrates a multi-station arrangement of apparatus for forming multilayered three dimensional objects in accordance with the invention.

The arrangement illustrated generally includes a first station 10 having an inking system 11 which is adapted to apply uncured polymer resin, which may be in the form of a viscous ink, from a trough or well 12 containing the resin to an offset lithographic plate 13. The inking system 11 includes a bank of inking rollers 14 which are adapted to transfer the negative fluid resin within the trough 12 to the inking roller 15 which applies the paste-like resin to the plate 13. The plate 13 has a plurality of sections 16, with each of the sections representing the negative portion of an individual cross-sectional segment. The surface of the plate 13 (shown in FIG. 2A) is coated with a very thin silicone coating 17 which is not wet by the negative fluid resin. Portions of the coating 17 are removed to expose portions of the plate 13 which is wet by the negative resin and represents the negative image area 19 of one cross-section of the three dimensional object. When the negative resin is applied to the upper surface of plate 13, the resin stays only on the image areas 19 (shown in FIG. 2A) of the plate which are wet by the resin.

The second station 20 has a transfer roller 21 (sometimes called a blanket roller) which is adapted to be rolled against the upper surface of the lithographic plate 13 and thereby pick up thin viscous layers of the uncured polymer resin from the image area 19 of the lithographic plate 13 in the desired shape. Note that the thicknesses of the layers of negative material are greatly exaggerated in FIG. 2A-2F. The surface of the transfer roller 21 which contacts the lithographic plate 13 and picks up the layers of uncured negative resin is preferably provided with a rubber-like or elastomeric coating 22 to facilitate the pick-up and subsequent application of the uncured resin.

In the third station 23, the relative position of the transfer roller 21 is changed with respect to the substrate 24 which is disposed under the transfer roller and which has a plurality of formation sites 25 thereon. The roller 21 is lowered so that the rubber-like or elastomeric coating 22 provided on the exterior on the roller is pressed into contact with the formation sites 25 on the substrate 24 and is rolled against the substrate to apply thin layers of uncured negative resin in the desired shapes onto the formation sites, so that negative resin from each segment of the plate 13 forms a negative resin image on a distinct formation site 25.

After a layer of negative resin is applied to each of the formation sites 25, the substrate 24 is transferred to the fourth station 26 where the resin is radiation cured by the ultraviolet (U.V.) lamps 27 and 28.

The substrate 24 is shifted to the fifth station 30, after the negative resin has been cured, where uncured positive resin 31 is applied to each of the formation sites 25 so that it fills the shallow recesses formed by the cured negative resin and is then leveled with a doctor blade 32 to remove any excess positive resin, The shallow recesses formed by the cured negative resin may act as molds for the positive resin. In a presently preferred embodiment, a plurality of sublayers of the negative resin are applied and cured as above for each layer of positive resin. This technique provides a much smoother and more accurate surface for the finished three dimensional product.

After the positive resin 31 has been leveled, the substrate 24 is then shifted to the sixth and final station 33 of the cycle wherein the uncured positive resin 31 is cured by U.V. radiation from lamps 34 and 35. If desired a single curing station may be employed for curing both the negative and the positive materials. After the positive resin is cured, the upper surface of the negative and positive resin may be mechanically or chemically treated in order to level the upper surface or to otherwise adjust layer thickness. Such surface treatment may also be used to facilitate the bonding of a subsequently applied layer. Abrading with a very fine sandpaper has been found to be a suitable treatment. Other methods include a corona treatment.

In this single cycle each cross-sectional layer of the three dimensional product is formed on a formation site 25 in the same sequence in which each layer appears in the final product. Upon curing the positive resin 31, the substrate 24 is returned to the third station 23 where another cycle is initiated by applying negative polymer resin layers to the cured layers of positive and negative polymers on the formation sites 25 as previously discussed. However, in order to apply the layers in their proper sequence at each of the formation sites 25, the register of the transfer roller 21 is shifted one formation site with respect to the substrate 24 so that a first layer can be applied to a bare formation site on the substrate 24 to begin the wedge formation shown and the next layer can be applied in the respective sequence for the other respective formation sites. The substrate 24 again passes through the third station through the sixth station as previously described and then is returned to the third station for yet another cycle. Incomplete products are formed until the wedge is completely formed, but once the wedge is completely formed, each cycle will produce a complete three dimensional product. The formation cycles continue until the desired number of three dimensional products are made. New substrates must be added as the wedge progresses along and usually the substrates of finished objects are removed.

Figures 2A, 2B, 2C, 2D, 2E, 2F:
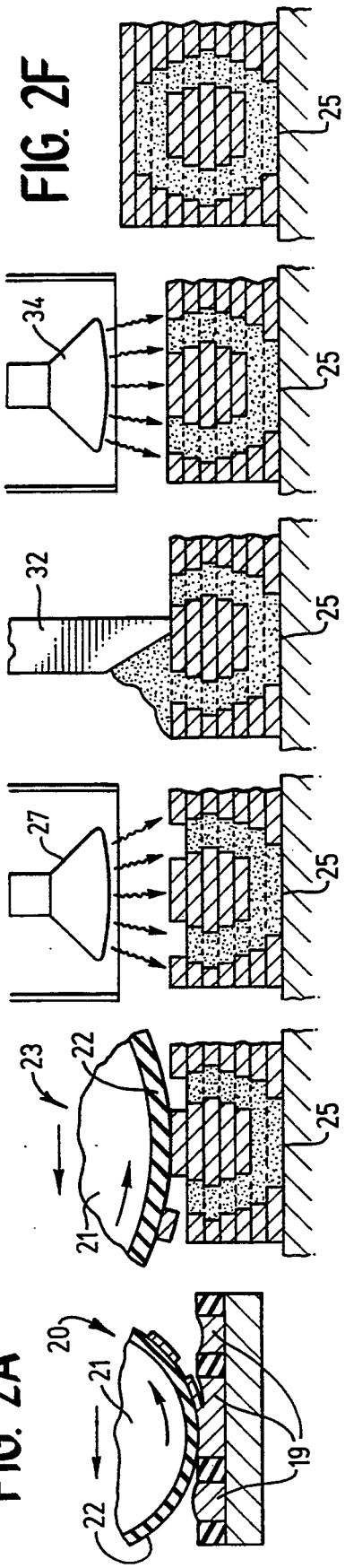
FIGS. 2A–2F schematically illustrate the steps in the formation of a single layer in a multilayered three dimensional object with the apparatus shown in FIG. 1.

FIGS. 2A-2F illustrate in more detail the formation of idealized three dimensional products. The views given are transverse cross-sectional views of elongated (as shown in FIG. 1) three dimensional products. FIG. 2A begins with the second stage 20 where the transfer roller 21 is rolled against the upper surface of the lithographic plate 13. The upper surface of the plate 13 is provided with a coating 17 which is not wet by the negative resin. Portions of the coating 17 are removed to provide image areas 19 on the plate which are wet by the negative resin. In this manner, the image areas 19 are covered with liquid negative resin. When the transfer roller 21 is rolled against the upper surface of the plate 13, the surface 22 of the transfer roller picks up thin layers of the negative resin (the thickness of the layers are highly exaggerated in the drawing) from the image areas 19 in the desired size and shape of the cross-sectional segment. In FIG. 2B the third stage 23 is illustrated wherein the thin layers of negative resin on the transfer roller 21 are applied to the formation sites 25 on the substrate 24. While not shown in the drawings, usually there is a very thin residual amount of the negative resin left on the transfer roller 21 after applying the resin to the formation sites 25. The residuum is in essentially the same shape and parametric dimensions on the roll i.e. the same image, as the layer picked up from the lithographic plate 13 and applied to the formation sites 25. The relative thicknesses of the transferred and residual negative resin are governed by the material properties and processing conditions in a manner similar to that found in offset lithographic printing.

FIG. 2C depicts the curing of the negative resin by U.V. lamps 27 and 28 as previously described in the fourth station. In the fifth station as shown in FIG. 2D uncured positive liquid resin is applied to the upper surface of the formation sites to fill up the recesses formed by the cured negative resin. A doctor blade 32 is drawn across the upper surface to remove excess positive liquid resin. The remaining positive liquid resin is cure by U.V. radiation from the lamps 34 and 35 as shown in FIG. 2F. A single curing station can be provided, if desired, for curing both the positive and negative resins.

The positive resin may carry a substantial load of consolidatable material such as powdered metal (e.g. about 25–60%, preferably about 35–50% by volume), which forms the ultimate three dimensional product, so that upon the curing of all the layers of positive material, it can be heated to debinderize the resin and then sintered to consolidate the powder metal carried by the resin. The shrinkage involved with the consolidation must be taken into consideration when developing the sizes and shapes of the individual layers of the positive and negative material to ensure that the consolidated final product is of the desired size and shape. The negative resin also preferably carries a similar load of powdered material to control the viscosity and other properties of the liquid resin, but the powdered material should not consolidate at the temperature at which the powdered metal in the positive resin consolidates. In this manner, when the negative resin is removed by debinderizing, only a loose powder remains. The powder incorporated into the negative resin may also function to prevent objects or layers of positive material from welding or otherwise bonding together during sintering and other procedures. Conventional powder metallurgical techniques such as those used in metal injection molding can be employed to consolidate and otherwise finish the metal product. Ceramics and other consolidatable materials may also be employed. The finished sintered product should have a density of at least 90% of theoretical density and it typically has a density of at least 97% of theoretical density. To form products of plastic and other consolidatable material, the use of powder is not required in the positive resin.

Figure 3:
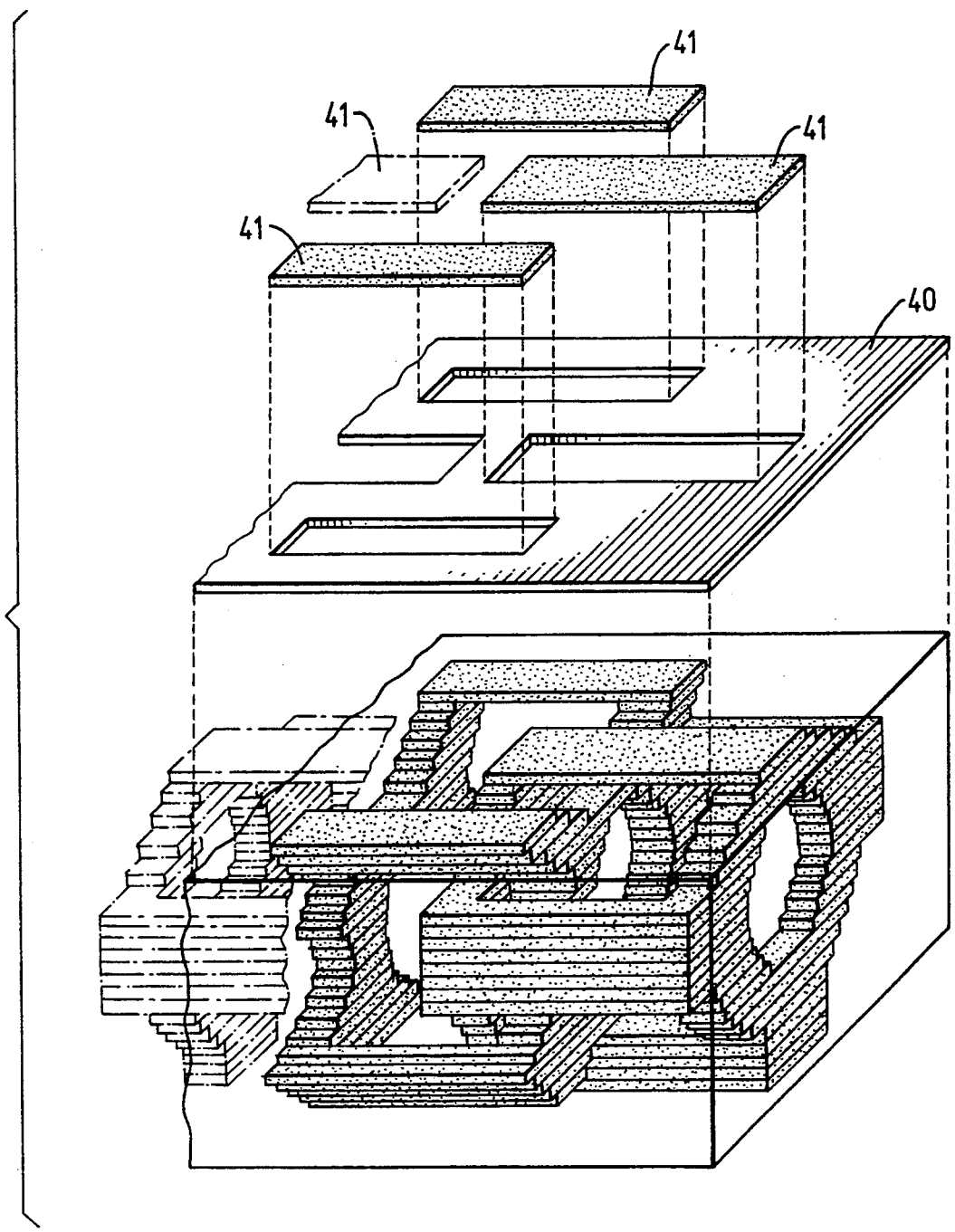
FIG. 3 is a perspective view of a multilayered three dimensional assembly of multiple intermoving components which can be made with the method and system of the invention.

FIG. 3 illustrates a three dimensional product with parts which are formed together and which are movable with respect to one another which was formed from a plurality of thin layers in accordance with the invention. Also shown in the exploded view are the elements 40 of the negative portions and elements 41 of the positive portions of a single layer.

EXAMPLE

In one preferred embodiment of the invention a negative resin, a polyurethane acrylate (Resin 783 sold by Morton Thiokol, Inc. of Chicago, Ill.), with about 20% of boron nitride powder incorporated therein was applied to about 8,000 formation sites on a substrate. About 20–30 sub-layers of the negative resin about 0.3 microns thick were applied and cured. Positive resin, an epoxy acrylate (600 Ebecryl Resin sold by Radcure Specialties, Inc. of Louisville, Ky.), with about 50% by volume of stainless steel powder was applied onto the surfaces of the formation sites to fill up the shallow recesses therein which were defined by the plurality of sub-layers of negative material and was then cured. The process was repeated until the total number of positive resin layers applied and cured was 20. Upon curing the final layer of positive resin, the semifinished product was placed in a furnace and subjected to temperatures of about 800° C. in a hydrogen atmosphere to debinderize the positive and negative resin. The stainless steel powder at this point is consolidated sufficiently to maintain its shape and the boron nitride remains to prevent the sticking or welding of the steel parts but can be easily removed after sintering. The semiconsolidated stainless steel product is then sintered at a temperature of 1250° C. in an inert atmosphere containing a partial pressure of argon to consolidate the stainless steel product to its final size, shape and density. Only minor surface finishing is needed to produce the final product. The overall dimension of the product was about 0.5 by 0.5 by 0.1 mm.

While the invention has been discussed herein primarily in terms of forming solid and multi-component three dimensional objects, the method and system of the invention may be used to form a wide variety of three dimensional objects. For example, thick film or co-fired electrical circuits can be formed with much finer line widths and spacings, more accurately controlled dimensions and thicknesses and much more complex three dimensional geometries than are presently obtainable by other methods. Various combinations of conductive materials with various non-conductive materials separating the conductive materials can be applied to form a wide variety circuits. Line width and spacing for the conductive material can be controlled to about 0.0005 inch and lower and transferred layer thickness can be controlled to 0.2 microns or lower or can be built up to be relatively thick. In this instance the conductive and nonconductive material would remain in the final three dimensional product. Importantly, these line widths and spacings can be achieved in a high volume production.

While the present invention has been described herein in terms of certain preferred embodiments, modifications and improvements can be made without departing from the scope of the invention.

What is claimed is:

1. A method for forming a three dimensional object having a desired size and shape, comprising:
   a) developing shapes and dimensions for a group of individual cross-sectional segments which, when put together in a particular sequence, form the desired shape of the three dimensional object in the desired size;
   b) providing a plurality of formation sites for forming three dimensional objects in a linear array;
   c) forming by suitable means out of suitable material each segment of a first group of individual cross-sectional segments on the individual formation sites in the developed shapes and dimensions and in the aforesaid particular sequence along the linear array;
   d) adjusting relative positions between the formation sites on which the first group of individual cross-sectional segments have been formed and the means employed to form the cross-sectional segments thereon to align the means to form the cross-sectional segments with the appropriate formation sites so that next individual layers in proper sequence may be formed on previously formed cross-sectional segments; and
   e) repeating the steps c) and d) for sufficient number of additional cycles to form at least one three dimensional object in the desired size and shape.

2. The method of claim 1 wherein the relative positions between the formation sites and the means employed to form the cross-sectional segments are adjusted one formation site.

3. The method of claim 1 wherein the number of formation sites for forming three dimensional objects equal at least the number of different cross-sectional segments needed to form the desired three dimensional object.

4. The method of claim 3 wherein individual layers of materials are formed at the formation sites in the shapes and dimensions for all of the cross-sectional segments and in the particular sequence developed to form the desired three dimensional object.

5. The method of claim 1 wherein the individual layers are formed of a plurality of materials.

6. The method of claim 5 wherein a partial layer of first material at a particular level at a formation site defines at least in part a partial layer of second material at the same level at the formation site.

7. The method of claim 6 wherein the first material is removed, leaving a three dimensional object formed of the second material having the desired shape.

8. The method of claim 5 wherein at least one of the plurality of materials forming a layer contains polymerizable plastic resin.

9. The method of claim 5 wherein at least one of the plurality of materials contains sinterable components.

10. The method of claim 5 wherein at least one of the materials is consolidated by polymerization.

11. The method of claim 10 herein the polymerization is effected by means of radiation.

12. The method of claim 5 wherein the consolidation is effected by solvent evaporation.

13. The method of claim 5 wherein at least one material is consolidated by sintering.

14. The method of claim 13 wherein the sintering is effected by the application of monochromatic radiation.

15. The method of claim 1 wherein the layers are applied by printing.

16. The method of claim 15 wherein the printing is offset lithography.

17. A method of making a plurality of three dimensional objects of a desired size and shape, comprising:
   a) developing shapes and dimensions for a group of individual cross-sectional segments which, when assembled together in a particular sequence, form the desired shape of the three dimensional object in the desired size;
   b) in a first cycle forming a first cross-sectional segment having the developed shape and dimensions by
   forming a first layer of a removable first material in a first pattern at a formation site; and
   forming a first layer of a second material in a second pattern at the same formation site at which the first layer of first material is formed, the layer of removable first material shaping at least part of the first layer of the second material forming a cross-sectional segment having a desired shape and desired dimensions;
   c) subsequently forming in a plurality of cycles at the formation site other cross-sectional segments having a desired shape and desired dimensions in the particular sequence, with each subsequent cross-sectional segment being bonded to the previously formed cross-sectional segment until a three dimensional object of the desired size and shape is formed; and
   d) removing the removable first material from the formed three dimensional object.

18. The method of claim 17 wherein the layer of first material at a particular level at a formation site defines at least in part the layer of second material at the same level at the formation site.

19. The method of claim 17 wherein at least one of the first and second materials contains polymerizable plastic resin.

20. The method of claim 17 wherein at least one of the first and second materials contains sinterable components.

21. The method of claim 19 wherein at least one of the materials are consolidated by polymerization.

22. The method of claim 21 wherein the polymerization is effected by means of radiation.

23. The method of claim 17 wherein the consolidation is effected by solvent evaporation.

24. The method of claim 20 wherein at least one material is consolidated by sintering.

25. The method of claim 24 wherein the sintering is effected by the application of monochromatic radiation.

26. The method of claim 17 wherein at least one of the layers are applied by printing.

27. The method of claim 26 wherein the printing is offset lithographic printing.

28. The method of claim 17 wherein the first material is removed, leaving the desired three dimensional product.

* * * * *